United States Patent
Oh

(10) Patent No.: US 8,969,888 B1
(45) Date of Patent: Mar. 3, 2015

(54) FLAT PANEL DISPLAY APPARATUS AND METHOD OF MANUFACTURING THE SAME

(71) Applicant: Samsung Display Co., Ltd., Yongin, Gyeonggi-Do (KR)

(72) Inventor: Jeong-Seok Oh, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/073,837

(22) Filed: Nov. 6, 2013

(30) Foreign Application Priority Data

Aug. 16, 2013 (KR) ........................ 10-2013-0097344

(51) Int. Cl.
   *H01L 29/18* (2006.01)
   *H01L 21/00* (2006.01)
   *H01L 33/52* (2010.01)
   *H01L 33/00* (2010.01)
   *H01L 23/00* (2006.01)

(52) U.S. Cl.
   CPC ............ *H01L 33/52* (2013.01); *H01L 33/0095* (2013.01); *H01L 23/564* (2013.01)
   USPC ............................................. 257/88; 438/22

(58) Field of Classification Search
   CPC ..... H01L 33/52; H01L 33/54; H01L 33/0095; H01L 23/564; H01L 23/3107; H01L 23/16; H01L 29/66088; H01L 29/7828; H01L 29/0615; H01L 29/0638; H01L 29/45; H01L 29/1608

USPC .......... 257/40, 88; 348/58; 438/22, 70, 28, 34
See application file for complete search history.

(56) References Cited

U.S. PATENT DOCUMENTS

| | | | | |
|---|---|---|---|---|
| 5,387,445 | A | * | 2/1995 | Horiuchi et al. ............... 428/1.54 |
| 7,335,913 | B2 | * | 2/2008 | Murade ............................ 257/59 |
| 7,662,704 | B2 | * | 2/2010 | Yasukawa ...................... 438/489 |
| 2006/0290273 | A1 | | 12/2006 | Kang et al. |
| 2008/0078991 | A1 | * | 4/2008 | Kim ................................. 257/40 |
| 2010/0117067 | A1 | | 5/2010 | Sin et al. |
| 2013/0077058 | A1 | * | 3/2013 | Miyashita ........................ 353/52 |

FOREIGN PATENT DOCUMENTS

| | | |
|---|---|---|
| KR | 10-2005-0022538 A | 3/2005 |
| KR | 10-2009-0041613 A | 4/2009 |
| KR | 10-2010-0052895 A | 5/2010 |
| KR | 10-2011-0020613 A | 3/2011 |
| KR | 10-2011-0072131 A | 6/2011 |

* cited by examiner

*Primary Examiner* — Nikolay Yushin
(74) *Attorney, Agent, or Firm* — Christie, Parker & Hale, LLP

(57) ABSTRACT

A flat panel display apparatus including a substrate on which a display unit is formed, an encapsulation member that covers the display unit, a sealant that is formed between the substrate and encapsulation member while the sealant encapsulates the display unit by surrounding the display unit, and a metal layer that is formed on the substrate and located along with the sealant, the metal layer having irregular widths.

16 Claims, 3 Drawing Sheets

FLAT PANEL DISPLAY APPARATUS AND METHOD OF MANUFACTURING THE SAME

CROSS-REFERENCE TO RELATED APPLICATION

This application claims priority to and the benefit of Korean Patent Application No. 10-2013-0097344, filed on Aug. 16, 2013, in the Korean Intellectual Property Office, the disclosure of which is incorporated herein in its entirety by reference.

BACKGROUND

1. Field

One or more embodiments of the present invention relate to a flat panel display apparatus and a method of manufacturing the flat panel display apparatus.

2. Description of the Related Art

A display unit of a flat panel display apparatus including an organic light-emitting display apparatus may deteriorate due to moisture penetration. Thus, in order to prevent penetration of external moisture, the flat panel display apparatus needs to include an encapsulation structure so as to seal and protect the display unit.

In an example of the encapsulation structure which is employed, an encapsulation member covers a glass substrate whereon a display unit is formed, and a sealant such as frit is used to seal a gap between the glass substrate and the encapsulation member. That is, the frit is coated around the display unit of the glass substrate, the encapsulation member covers the glass substrate, and then a laser is irradiated to cure the frit, so that encapsulation is achieved.

SUMMARY

Aspects of embodiments of the present invention are directed toward a flat panel display apparatus and a method of manufacturing the flat panel display apparatus.

Additional aspects will be set forth in part in the description which follows and, in part, will be apparent from the description, or may be learned by practice of the presented embodiments.

According to one or more embodiments of the present invention, a flat panel display apparatus includes a substrate on which a display unit is formed, an encapsulation member that covers the display unit, a sealant that is formed between the substrate and encapsulation member and encapsulating the display unit by surrounding the display unit, and a metal layer that is formed on the substrate and located along with the sealant, wherein the metal layer has irregular widths.

The metal layer may have a shape composed of a plurality of straight-line round portions and a plurality of corner portions that connect the plurality of straight-line round portions, and central widths of the plurality of straight-line round portions may be relatively large and other widths of the plurality of straight-line round portions may be decreased moving toward the plurality of corner portions.

The metal layer may have a shape that corresponds to a stress distribution that is generated when a shock is applied to the sealant.

The metal layer may have a close-loop shape that surrounds the display unit.

The metal layer may have an open-loop shape that partially surrounds the display unit with a portion of the open-loop shape being opened.

The sealant may include frit that is cured by having a laser irradiated thereto.

According to one or more embodiments of the present invention, a method of manufacturing a flat panel display apparatus includes operations of forming a display unit on a substrate; forming a metal layer that has irregular widths on an outer side of the display unit on the substrate; forming a sealant that surrounds the display unit along the metal layer; covering an encapsulation member on the sealant; and curing the sealant.

The metal layer may be formed to have a shape formed of a plurality of straight-line round portions and a plurality of corner portions that connect the plurality of straight-line round portions, and central widths of the plurality of round portions may be relatively large and other widths of the plurality of round portions may be decreased moving toward the plurality of corner portions.

The metal layer may be formed to have the shape that corresponds to a stress distribution that is generated when a shock is applied to the sealant.

The metal layer may be formed to have a close-loop shape that surrounds the display unit.

The metal layer may be formed to have an open-loop shape that partially surrounds the display unit with a portion of the open-loop shape being opened.

The sealant may include frit that is cured by having a laser irradiated thereto.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
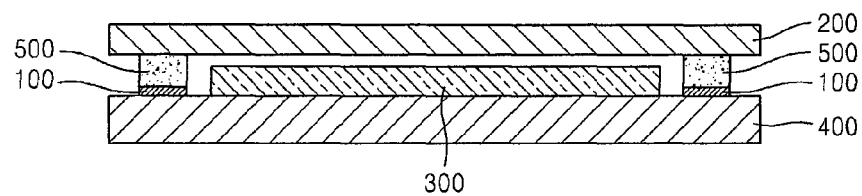
FIG. 1 is a cross-sectional view of a flat panel display apparatus according to an embodiment of the present invention.

As one or more embodiments of the present invention allow for various changes and numerous embodiments, particular embodiments will be illustrated in the drawings and described in detail in the written description. Reference will now be made in more detail to embodiments, examples of which are illustrated in the accompanying drawings. In this regard, the present embodiments may have different forms and should not be construed as being limited to the descriptions set forth herein.

Hereinafter, one or more embodiments of the present invention will be described below in more detail with reference to the accompanying drawings. Those components that are the same or are in correspondence are rendered the same reference numeral regardless of the figure number, and redundant explanations are omitted.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Also, the use of "may" when describing embodiments of the present invention refers to "one or more embodiments of the present invention."

Figure 2:
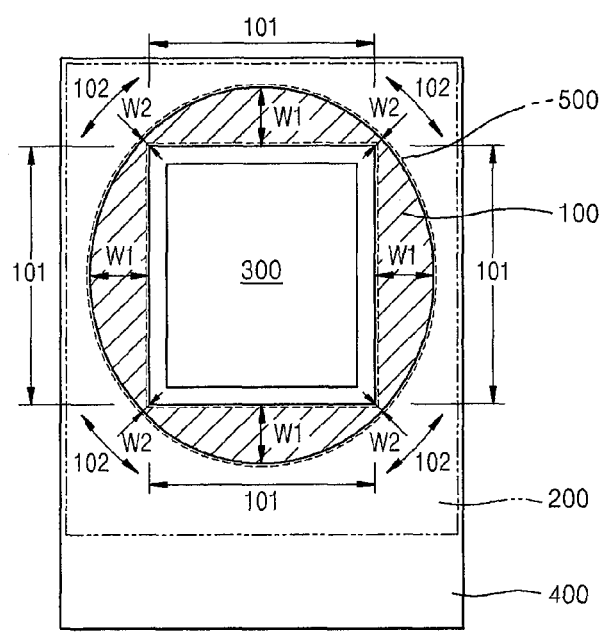
FIG. 2 is a plan view of the flat panel display apparatus of FIG. 1.

FIGS. 1 and 2 are cross-sectional and plan views, respectively, which illustrate a flat panel display apparatus according to an embodiment of the present invention.

As illustrated, the flat panel display apparatus includes, but is not limited to, a substrate 400, a display unit 300 formed on the substrate 400, an encapsulation member 200 covering the display unit 300, and a sealant 500 sealing a gap between the substrate 400 and the encapsulation member 200 by surrounding (e.g., being around or entirely surrounding) the display unit 300 to seal in the display unit 300. A metal layer 100 is formed between the substrate 400 and the sealant 500, and functions to help the sealant 500 to be firmly cured with small energy. That is, a material of the sealant 500 generally includes frit that is cured by having a laser irradiated thereto, and in this regard, when the sealant 500 is formed on the metal layer 100 and then the laser is irradiated onto the metal layer 100, the metal layer 100 reflects the laser into the sealant 500, so that the sealant 500 may be firmly cured by using a small amount of laser power.

As illustrated in FIG. 2, the metal layer 100 surrounds the display unit 300, and has a plurality of straight-line round portions 101 (i.e., round portions with straight-lines) and a plurality of corner portions 102 that connect the straight-line round portions 101. The metal layer 100 has an irregular shape in which central widths W1 of the straight-line round portions (the round portions) 101 are largest and other widths of the round portions 101 are decreased moving toward the corner portions 102 (i.e., the other widths of a corresponding one of the round portions 101 are decreased from about the central width W1 to be about the width W2 of a corresponding one of the corner portions 102 when moving toward the corresponding one of the corner portions 102).

The irregular shape corresponds to a stress distribution that is generated when an external shock is applied to the sealant 500. That is, when the external shock is applied to the sealant 500, a stress increases from the corner portions 102 toward centers of the round portions 101. Thus, a width of the metal layer 100 irregularly varies so as to match with the stress distribution. By doing so, although a laser is equally irradiated, the centers of the round portions 101 of the metal layer 100 which have the relatively larger central widths W1 may be further firmly cured than the corner portions 102 having the relatively smaller widths W2. That is, since the central widths W1 of the round portions 101 to which more stress is applied is formed to be the largest portion, the sealant 500 may be induced to be firmly cured at the central widths W1 of the round portions 101. The sealant 500 is formed to have the same or substantially the same shape as the metal layer 100.

Figure 3:
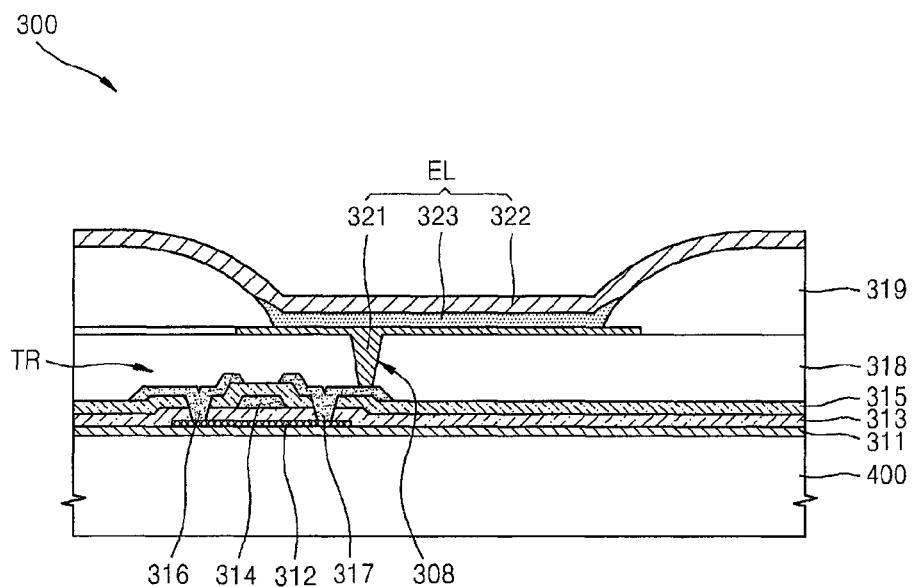
FIG. 3 is a cross-sectional view of a detailed structure of a display unit illustrated in FIG. 1.

The display unit 300 is a region in which an image is realized, and as illustrated in a magnified view of FIG. 3, a structure of the display unit 300 includes an organic light emitting device (OLED) EL in which a pixel electrode 321, an emission layer (EML) 323, and an opposite electrode 322 are sequentially stacked, and a thin film transistor (TFT) TR that is connected to the pixel electrode 321 of the OLED EL.

The TFT TR includes, but is not limited to, an active layer 312, a gate electrode 314, a source electrode 316, and a drain electrode 317. A gate insulating layer 313 is interposed (for insulation) between the gate electrode 314 and the active layer 312.

The active layer 312 may be formed on a buffer layer 311. The active layer 312 may include various materials. For example, the active layer 312 may include an inorganic semiconductor material such as amorphous silicon or polysilicon. In an embodiment, the active layer 312 may include an oxide semiconductor. In another embodiment, the active layer 312 may include an organic semiconductor material.

The gate insulating layer 313 is formed on the buffer layer 311 so that the gate insulating layer 313 covers the active layer 312, and then the gate electrode 314 is formed on the gate insulating layer 313.

An interlayer insulating layer 315 is formed on the gate insulating layer 313 so as to cover the gate electrode 314, and the source electrode 316 and the drain electrode 317 are formed on the interlayer insulating layer 315 and then are connected to the active layer 312.

A planarization layer 318 that covers the TFT TR is formed on the interlayer insulating layer 315. The planarization layer 318 may be formed of an inorganic material and/or an organic material.

Here, the metal layer 100 may be formed via a process separate from a process of the display unit 300, or the metal layer 100 may be formed together when a metal layer of the display unit 300 (such as the gate electrode 314 or the source electrode 316 and the drain electrode 317) is formed.

Next, the OLED EL is formed on the planarization layer 318 and includes the pixel electrode 321, the EML 323, and the opposite electrode 322. A pixel defining layer (PDL) 319 is formed on the planarization layer 318 and the pixel electrode 321, and defines a pixel region and a non-pixel region.

The EML 323 may be formed as a single layer or a composite layer in which a hole injection layer (HIL), a hole transport layer (HTL), an electron transport layer (ETL), an electron injection layer (EIL), or the like are formed above or below the EML 323.

The pixel electrode 321 is formed on the planarization layer 318, so that the pixel electrode 321 is electrically connected to the drain electrode 317 of the TFT TR via a through hole 308.

The pixel electrode 321 may function as an anode electrode, and the opposite electrode 322 may function as a cathode electrode but polarities of the pixel electrode 321 and the opposite electrode 322 may be switched.

The PDL 319 defines the pixel region and the non-pixel region of the OLED EL by having an opening that exposes the pixel electrode 321. Although FIG. 3 illustrates one opening, the PDL 319 may have a plurality of openings, and the pixel electrode 321, the EML 323, and the opposite electrode 322 may be sequentially stacked in each of the plurality of openings and are thus configured to emit light.

Since the plurality of openings are formed, the flat panel display apparatus may include a plurality of the OLEDs EL. Pixels may be formed at the plurality of the OLEDs EL, respectively, and each of the pixels may emit red, green, blue, or white light. Alternatively, the EML 323 may be commonly formed on an entire surface of the planarization layer 318, regardless of a pixel position. Here, the EML 323 may have a structure in which layers that include emission materials for emitting red light, green light, and blue light may be vertically stacked or the emission materials may be mixed. A combination of other colors may also be possible, provided that the combination of other colors may emit white light. Also, the EML 323 may further include a color filter or a color conversion layer that converts the emitted white light into a set or predetermined color.

Figure 4A:
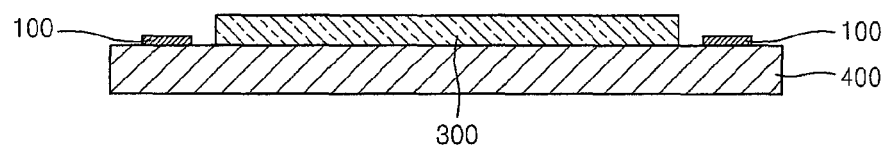
FIGS. 4A and 4B illustrate processes of manufacturing the flat panel display apparatus of FIG. 1, according to an embodiment of the present invention.
Figure 4B:
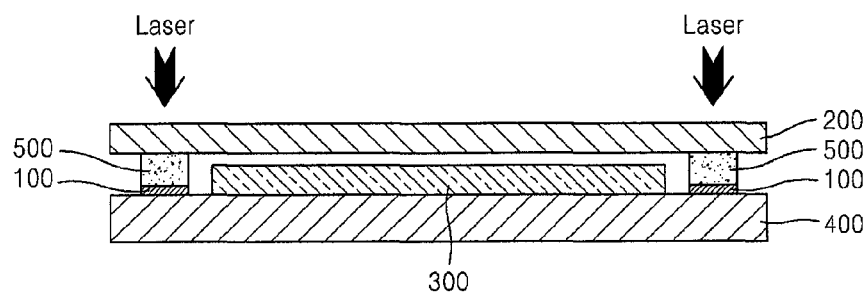

The flat panel display apparatus according to the present embodiment may be manufactured via processes shown in FIGS. 4A and 4B.

First, as illustrated in FIG. 4A, the display unit 300 is formed on the substrate 400, and the metal layer 100 having the shape shown in FIG. 2 is formed around the display unit 300.

Here, as described above, the metal layer 100 may be formed via the process separate from the process of the display unit 300, or the metal layer 100 may be formed together when the metal layer of the display unit 300 (such as the gate electrode 314 or the source electrode 316 and the drain electrode 317) is formed.

Afterward, as illustrated in FIG. 4B, frit as the sealant 500 is coated on the metal layer 100, the encapsulation member 200 covers the display unit 300, and then a laser is irradiated. Then, the sealant 500 is cured by the laser, and here, the metal layer 100 reflects the laser into the sealant 500 so that the metal layer 100 facilitates the cure.

Since the centers of the round portions 101 of the metal layer 100 are larger than the corner portions 102, although the laser is equally irradiated, the centers of the round portions 101 are further firmly cured. By doing so, the centers of the metal layer 100 to which a stress of the sealant 500 is highly concentrated are most-firmly formed, to counter the stress incurred by a shock that is applied to the sealant 500, so that a shock-resistant characteristic of the flat panel display apparatus (including the display unit 300) may be greatly improved.

Figure 5:
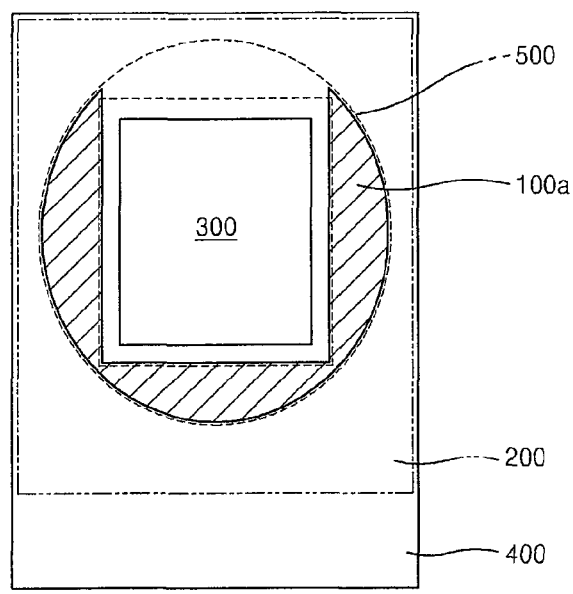
FIG. 5 is a cross-sectional view of a flat panel display apparatus according to another embodiment of the present invention.

In the present embodiment, the metal layer 100 has a close-loop shape that completely surrounds the display unit 300 to match the sealant 500. However, in another embodiment, as illustrated in FIG. 5, the metal layer 100 may be modified into a metal layer 100a having an open-loop shape. That is, compared to the previous embodiment, in the embodiment of FIG. 5, a portion of the metal layer 100a is removed so that the metal layer 100a is open. By doing so, although the metal layer 100a is largely formed, interruption due to electromagnetic waves, generation of static electricity, or a decrease of antenna reception, which may be incurred by the metal layer 100a, may be decreased. That is, according to the present embodiment, a shock-resistant characteristic of flat panel display apparatus (including the display unit 300) may be improved, and a possibility of side effects may be effectively suppressed.

As described above, according to the one or more of the above embodiments of the present invention, the flat panel display apparatus is manufactured in such a manner that a sealant portion to which a stress due to an applied shock is highly concentrated is most-firmly formed, thus, a shock-resistant characteristic of the flat panel display apparatus may be improved and a product reliability may be highly increased.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. A flat panel display apparatus comprising:
   a substrate;
   a display unit on the substrate;
   an encapsulation member covering the display unit;
   a sealant between the substrate and encapsulation member and encapsulating the display unit by surrounding the display unit; and
   a metal layer on the substrate and located along with the sealant,
   wherein the metal layer has irregular widths,
   wherein the metal layer has a shape composed of a plurality of round portions and a plurality of corner portions connecting the plurality of round portions, and
   wherein central widths of the plurality of round portions are relatively large and other widths of the plurality of round portions are decreased moving toward the plurality of corner portions.

2. The flat panel display apparatus of claim 1, wherein the plurality of round portions are formed to have straight-lines.

3. The flat panel display apparatus of claim 1, wherein the other widths of a corresponding one of the plurality of round portions are decreased from about the central width to be about the width of a corresponding one of the corner portions when moving toward the corresponding one of the corner portions.

4. The flat panel display apparatus of claim 1, wherein the metal layer has a shape corresponding to a stress distribution that is generated when a shock is applied to the sealant.

5. The flat panel display apparatus of claim 1, wherein the metal layer has a close-loop shape surrounding the display unit.

6. The flat panel display apparatus of claim 1, wherein the sealant comprises frit cured by having a laser irradiated thereto.

7. A flat panel display apparatus comprising:
   a substrate;
   a display unit on the substrate;
   an encapsulation member covering the display unit;
   a sealant between the substrate and encapsulation member and encapsulating the display unit by surrounding the display unit; and
   a metal layer on the substrate and located along with the sealant,
   wherein the metal layer has irregular widths, and
   wherein the metal layer has an open-loop shape partially surrounding the display unit with a portion of the open-loop shape being opened.

8. The flat panel display apparatus of claim 7, wherein the sealant comprises frit cured by having a laser irradiated thereto.

9. A method of manufacturing a flat panel display apparatus, the method comprising:
- forming a display unit on a substrate;
- forming a metal layer to have irregular widths on an outer side of the display unit on the substrate;
- forming a sealant to surround the display unit along the metal layer;
- covering an encapsulation member on the sealant; and
- curing the sealant,
- wherein the metal layer is formed to have a shape formed of a plurality of round portions and a plurality of corner portions connecting the plurality of round portions, and
- wherein central widths of the plurality of round portions are relatively large and other widths of the plurality of round portions are decreased moving toward the plurality of corner portions.

10. The method of claim 9, wherein the plurality of round portions are formed to have straight-lines.

11. The method of claim 9, wherein the other widths of a corresponding one of the plurality of round portions are decreased from about the central width to be about the width of a corresponding one of the corner portions when moving toward the corresponding one of the corner portions.

12. The method of claim 9, wherein the metal layer is formed to have a shape corresponding to a stress distribution that is generated when a shock is applied to the sealant.

13. The method of claim 9, wherein the metal layer is formed to have a close-loop shape surrounding the display unit.

14. The method of claim 9, wherein the sealant comprises frit cured by having a laser irradiated thereto.

15. A method of manufacturing a flat panel display apparatus, the method comprising:
- forming a display unit on a substrate;
- forming a metal layer to have irregular widths on an outer side of the display unit on the substrate;
- forming a sealant to surround the display unit along the metal layer;
- covering an encapsulation member on the sealant; and
- curing the sealant,
- wherein the metal layer is formed to have an open-loop shape partially surrounding the display unit with a portion of the open-loop shape being opened.

16. The method of claim 15, wherein the sealant comprises frit cured by having a laser irradiated thereto.

* * * * *